United States Patent
Dogon et al.

(10) Patent No.: US 10,318,308 B2
(45) Date of Patent: Jun. 11, 2019

(54) ARITHMETIC LOGIC UNIT

(71) Applicant: MOBILEYE VISION TECHNOLOGIES LTD., Jerusalem (IL)

(72) Inventors: Gil Israel Dogon, Jerusalem (IL); Yosi Arbeli, Rishon Le-Zion (IL); Yosef Kreinin, Jerusalem (IL)

(73) Assignee: Mobileye Vision Technologies Ltd., Jerusalem (IL)

( * ) Notice: Subject to any disclaimer, the term of this patent is extended or adjusted under 35 U.S.C. 154(b) by 0 days.

(21) Appl. No.: 13/664,475

(22) Filed: Oct. 31, 2012

(65) Prior Publication Data

US 2014/0122551 A1    May 1, 2014

(51) Int. Cl.
| | |
|---|---|
| G06F 9/38 | (2018.01) |
| G06F 17/16 | (2006.01) |
| H03H 17/06 | (2006.01) |
| G06F 9/30 | (2018.01) |
| G06F 15/80 | (2006.01) |

(52) U.S. Cl.
CPC ......... *G06F 9/3893* (2013.01); *G06F 9/3001* (2013.01); *G06F 9/30036* (2013.01); *G06F 17/16* (2013.01); *H03H 17/06* (2013.01); *G06F 15/8053* (2013.01)

(58) Field of Classification Search
CPC . G06F 7/575; G06F 7/57; G06F 17/15; G06F 17/16; H03H 17/06
USPC ...................................................... 712/2–22
See application file for complete search history.

(56) References Cited

U.S. PATENT DOCUMENTS

| | | | |
|---|---|---|---|
| 4,550,437 A | 10/1985 | Kobayashi et al. | |
| 4,975,843 A * | 12/1990 | Brunnett | G06T 1/20 378/4 |
| 5,081,573 A | 1/1992 | Hall et al. | |
| 5,610,850 A * | 3/1997 | Uratani | G06F 7/509 708/201 |

(Continued)

FOREIGN PATENT DOCUMENTS

| | | |
|---|---|---|
| EP | 0477011 A2 | 3/1992 |
| EP | 2728462 A2 | 5/2014 |

OTHER PUBLICATIONS

Wikipedia, External Storage, Feb. 25, 2011, p. 1.*

(Continued)

*Primary Examiner* — Chuong D Ngo
(74) *Attorney, Agent, or Firm* — Schwegman Lundberg & Woessner, P.A.

(57) ABSTRACT

An arithmetic logic unit (ALU) including a first routing grid connected to multiple data lanes to drive first data to the data lanes. A second routing grid is connected to the data lanes to drive second data to the data lanes. Each of the data lanes include multiple, e.g. N, functional units with first inputs from the first routing grid and second inputs from the second routing grid. The functional units compute pairwise a function of the respective first data on the respective first inputs and the respective second data on the respective second inputs. Each of the data lanes include a reduction unit with inputs adapted to receive K' bits per word from the functional units. The reduction unit is configured to perform a reduction operation configured to output an output result having a reduced number J' bits per lane, wherein J' is less than N multiplied by K'.

44 Claims, 8 Drawing Sheets

(56) References Cited

U.S. PATENT DOCUMENTS

| | | | |
|---|---|---|---|
| 5,822,606 A | 10/1998 | Morton | |
| 5,917,735 A * | 6/1999 | Ko | H03H 17/0275 375/229 |
| 5,970,254 A | 10/1999 | Cooke et al. | |
| 6,493,467 B1 * | 12/2002 | Okuda | G06T 1/20 382/260 |
| 6,573,936 B2 | 6/2003 | Morris et al. | |
| 6,901,422 B1 * | 5/2005 | Sazegari | G06F 17/16 708/607 |
| 7,484,076 B1 * | 1/2009 | Oberman et al. | 712/203 |
| 7,995,067 B2 | 8/2011 | Navon | |
| 8,200,940 B1 * | 6/2012 | Lindholm | 712/22 |
| 2005/0071413 A1 * | 3/2005 | Schulte et al. | 708/523 |
| 2005/0219422 A1 | 9/2005 | Dorojevets | |
| 2006/0095712 A1 * | 5/2006 | Selvaggi | G06F 7/509 712/22 |
| 2009/0182990 A1 * | 7/2009 | Muff et al. | 712/221 |
| 2011/0161625 A1 | 6/2011 | Pechanek | |
| 2012/0113133 A1 * | 5/2012 | Shpigelblat | G06F 9/30036 345/619 |
| 2014/0095842 A1 * | 4/2014 | Caprioli et al. | 712/222 |

OTHER PUBLICATIONS

Wikipedia, Absolute Difference, Sep. 11, 2011, p. 1.*

Marshall, Alan, et al. "A reconfigurable arithmetic array for multimedia applications." Proceedings of the 1999 ACM/SIGDA seventh international symposium on Field programmable gate arrays. ACM, 1999.

Sankaralingam, Karthikeyan, et al. "Exploiting ILP, TLP, and DLP with the polymorphous TRIPS architecture." Computer Architecture, 2003. Proceedings. 30th Annual International Symposium on. IEEE, 2003.

Nagarajan, Ramadass, et al. "A design space evaluation of grid processor architectures." Proceedings of the 34th annual ACM/IEEE international symposium on Microarchitecture. IEEE Computer Society, 2001.

Reddaway, St F. "DAP—a distributed array processor." ACM SIGARCH Computer Architecture News. vol. 2. No. 4. ACM, 1973.

Cronquist, Darren C., et al. "Architecture design of reconfigurable pipelined datapaths." Advanced Research in VLSI, 1999. Proceedings. 20th Anniversary Conference on. IEEE, 1999.

Mirsky, Ethan, and Andre DeHon. "MATRIX: a reconfigurable computing architecture with configurable instruction distribution and deployable resources." FPGAs for Custom Computing Machines, 1996. Proceedings. IEEE Symposium on. IEEE, 1996.

Jahr, Ralf, et al. "The Grid ALU Processor." Proceedings of ACACES (2008): 325-328.

Inoue, Koji, et al. "Alu-array based reconfigurable accelerator for energy efficient executions." SoC Design Conference (ISOCC), 2009 International. IEEE, 2009.

Manadhata, Pratyusa, and Vyas Sekar. "Vector Processors."

Vector Lane Threading (presentation), S. Rivoire, R. Schultz, T. Okuda, C. Kozyrakis, Computer Systems Laboratory, Stanford University, ICPP, Aug. 2006.

Rivoire, Suzanne, et al. "Vector lane threading." Parallel Processing, 2006. ICPP 2006. International Conference on. IEEE, 2006.

Yiannacouras, Peter, J. Gregory Steffan, and Jonathan Rose. "Improving Memory System Performance for Soft Vector Processors." Proc. of WoSPS 2008 (2008).

European Patent Office, Search report, App. No. EP13275256.9, dated Oct. 10, 2014.

"Chinese Application Serial No. 201811377785.9, Office Action dated Dec. 5, 2018", w/ Concise Statement of Relevance, 2 pg.

"European Application Serial No. 13275256.9, Communication Pursuant Article 94(3) EPC dated Jun. 16, 2016", 5 pgs.

"European Application Serial No. 13275256.9, Response filed Nov. 13, 2018 to Summons to Attend Oral Proceedings dated May 3, 2018", 9 pgs.

"European Application Serial No. 13275256.9, Response filed Dec. 5, 2015 to Extended European Search Report dated Oct. 10, 2014", 12 pgs.

"European Application Serial No. 13275256.9, Response filed Dec. 22, 2016 to Communication Pursuant to Article 94(3) EPC dated Jun. 16, 2016", 12 pgs.

"European Application Serial No. 13275256.9, Summons to Attend Oral Proceedings dated May 3, 2018", 12 pgs.

* cited by examiner

408

408

ARITHMETIC LOGIC UNIT

BACKGROUND

1. Technical Field

The present invention relates to computer architecture.

2. Description of Related Art

During the last few years camera based driver assistance systems (DAS) have been entering the market; including lane departure warning (LDW), Automatic High-beam Control (AHC), pedestrian recognition, and forward collision warning (FCW). These driver assistance systems may use real time image processing of multiple patches detected in multiple image frames captured from a camera mounted in a vehicle.

A vector processor, or array processor, is a processor that implements an instruction set containing instructions that operate on one-dimensional arrays of data called vectors. A scalar processor in comparison operates on a single datum. Most commonly used processors are scalar processors.

A vector processor, or array processor, processor such as a conventional central processing unit (CPU) that implements an instruction set containing instructions that operate on one-dimensional arrays of data or vectors. A scalar processor in contrast has instructions which operate on single data items.

VLIW (Very Long Instruction Word) digital signal processing units contain several sub-processing units which operate in parallel. The VLIW contains multiple op-codes which direct the various sub-processing units, thus allowing for parallel processing since each sub-unit gets its op-code at the same time. An op-code is a portion of a machine language instruction that specifies an operation to be performed.

The term "single-instruction-multiple-data" (SIMD) as used herein refers to a class of parallel computers with multiple processing elements that perform the same operation on multiple data points simultaneously. Thus, such SIMD machines exploit data level parallelism.

BRIEF SUMMARY

Various arithmetic logic units (ALU) may be provided including a first routing grid connected to multiple data lanes. The first routing grid is adapted to drive first data to the data lane. A second routing grid is connected to the data lanes. The second routing grid is adapted to drive second data to the data lanes. Each of the data lanes include multiple, e.g. N, functional units with first inputs from the first routing grid and second inputs from the second routing grid. The functional units are operable to compute pairwise a function of the respective first data on the respective first inputs and the respective second data on the respective second inputs. Each of the data lanes include a reduction unit with inputs adapted to receive K' bits per word from the functional units. The reduction unit is configured to perform a reduction operation configured to output an output result having a reduced number J' bits per lane, wherein J' is less than N multiplied by K'. The multiple data lanes may include N data lanes. A global control block may be configured to control the function of the functional units and to control first routing of the first routing grid and to control second routing of the second routing grid. The function may be performed between a datum a of the first data and a datum b of the second data. The function may be: a+b addition, a−b subtraction, a*b multiplication, a relational operation between a and b and absolute value of a difference ABS(a−b). The reduction operation may include addition, maximum and minimum. The data lanes may perform respective computations therein independently from each other.

Various methods may be performed for any of linear filtering, matrix multiplication, median filtering, local maximum filtering, local minimum filtering and sum of absolute difference filtering using the arithmetic logic unit as disclosed herein.

Various computational methods may be performed by an arithmetic logic unit (ALU) including first routing thereby driving first data to a multiple data lanes. Second routing thereby driving second data to the data lanes; and in the data lanes: (i) pairwise computing N instances of a function of the respective first data and the respective second data, thereby outputting N results having K' bits per word. (ii) performing an operation on the N results thereby outputting an output result having a reduced number J' bits per lane. J' is less than N multiplied by K'. The function is performed between a datum a of the first data and a datum b of the second data. The function may be: a+b addition, a−b subtraction, a*b multiplication, a relational operation between a and b and absolute value of a difference ABS(a−b). The N instances of the function are controlled to select the function and the first and second routing are controlled. Storage inside the ALU of the first and second data may be avoided and storage of intermediate results of the functions of the first and second data may be avoided.

The computations performed by the N instances of the data lanes may be performed performed independently.

The foregoing and/or other aspects will become apparent from the following detailed description when considered in conjunction with the accompanying drawing figures.

BRIEF DESCRIPTION OF THE DRAWINGS

The invention is herein described, by way of example only, with reference to the accompanying drawings, wherein.

DETAILED DESCRIPTION

Figure 1:
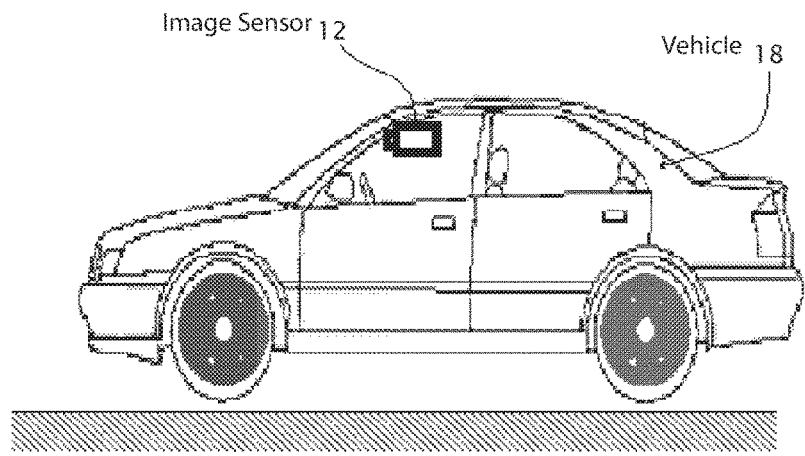
FIGS. 1 and 2 illustrate a system including a camera or image sensor mounted in a vehicle, according to an aspect of the present invention.

Reference will now be made in detail to features of the present invention, examples of which are illustrated in the accompanying drawings, wherein like reference numerals refer to the like elements throughout. The features are described below to explain the present invention by referring to the figures.

Before explaining features of the invention in detail, it is to be understood that the invention is not limited in its application to the details of design and the arrangement of the components set forth in the following description or illustrated in the drawings. The invention is capable of other features or of being practiced or carried out in various ways. Also, it is to be understood that the phraseology and terminology employed herein is for the purpose of description and should not be regarded as limiting.

Figure 2:
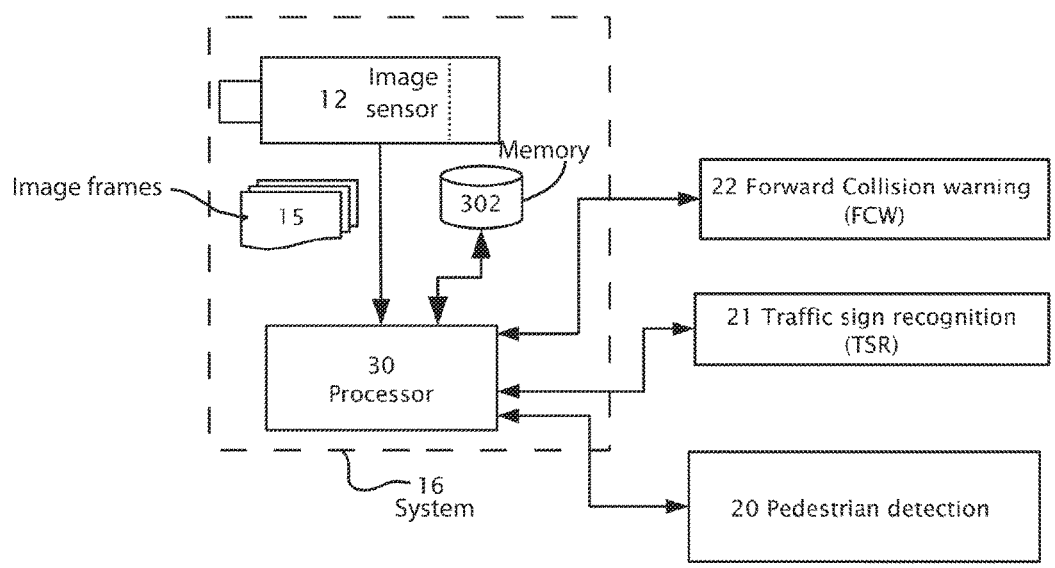

Reference is now made to FIGS. 1 and 2 which illustrate a system 16 including a camera or image sensor 12 mounted in a vehicle 18, according to an aspect of the present invention. Image sensor 12, imaging a field of view in the forward direction provides image frames 15 in real time and image frames 15 are captured by an image processor 30 which may be a vector processor. Vector processor 30 may be used to process image frames 15 simultaneously and/or in parallel to serve a number of driver assistance systems/applications. The driver assistance systems may be implemented using specific hardware circuitry with on board software and/or software control algorithms in memory 302. Image sensor 12 may be monochrome or black-white, i.e. without color separation or image sensor 12 may be color sensitive. By way of example in FIG. 2, image frames 15 are used to serve pedestrian detection 20, traffic sign recognition (TSR) 21 and forward collision warning (FCW) 22. Vector processor 30 may be used to process image frames 15 to detect and recognize an image or portions of the image in the forward field of view of camera 12.

In some cases, image frames 15 are partitioned between different driver assistance applications and in other cases the image frames 15 may be shared between the different driver assistance applications.

Although embodiments of the present invention are presented in the context of driver assistance applications, embodiments of the present invention may be equally applicable in other real time signal processing applications and/or digital processing applications, such as communications, machine vision, audio and/or speech processing as examples.

By way of introduction, aspects of the present invention are directed to increase the computational throughput through an SIMD arithmetic logic unit (ALU) of a processor 30 without having to pay a proportionate price in increasing register width and memory bandwidth.

The most common form of an SIMD instruction operates on N input pairs and produces N outputs e.g. N sums of the input pairs, N products of the input pairs, etc. For example, to square the throughput such that $N^2$ outputs are produced, $N^2$ input pairs are supplied. Therefore, squaring the throughput involves squaring the register size and the local memory bus, reaching the width of $N^2$. The cost of squaring the input is paid even if much of the time, only a fraction of the $N^2$ width is actually utilized, as it happens with inputs of size less than $N^2$.

It is thus beneficial to support, in processor 30 with registers keeping N items, SIMD instructions processing, generally, of more than N input pairs, and specifically, $N^2$ input pairs. In general, it is in fact possible, given a number of inputs proportionate to N, to process a number of input pairs proportionate to $N^2$, because the number of possible combinations of N numbers is indeed proportionate to $N^2$.

Any system making use of the above considerations to increase computational throughput is tailored to a particular domain. For example, instructions for multiplying complex numbers or for multiplying coordinate vectors by projection matrices in a computer graphics context are examples of SIMD instructions that indeed perform more operations than the amount of inputs SIMD processors receive. These instructions are tailored, respectively, for complex arithmetic and computer graphics and allow selections of the right input combinations to be processed.

The present invention in various embodiments includes systems for performing a number of operations proportionate to $N^2$ given a number of inputs proportionate to N and tailored for the needs of embedded computer vision. Example algorithms which map well to these systems and which are applicable in the domain of vision processing are:

Linear filtering (correlation/convolution) with one dimensional (1D) vertical/horizontal or two dimensional (2D) filters.

Matrix multiplication (used, in particular, in object classification)

Median filter

SAD (sum of absolute differences) filter (used, in particular, in image disparity computations and template matching.)

Local maximum filter

Methods for implementing these example algorithms are presented below.

Unlike in many systems with SIMD instructions tailored to a specific domain, in embodiments of the present invention there is no one-to-one mapping between instructions and supported algorithms. That is, while one will typically find instructions such as "multiply complex numbers" or "multiply a coordinate vector by a projection matrix", exemplary systems according to embodiments of the present invention do not have a "perform linear filter" instruction or feature—nor a "perform median filter" feature, a "perform matrix multiplication" feature, etc. Rather, the various algorithms are implemented in software through specific scheduling of more primitive operations on specific parts of the input data.

Figure 3:
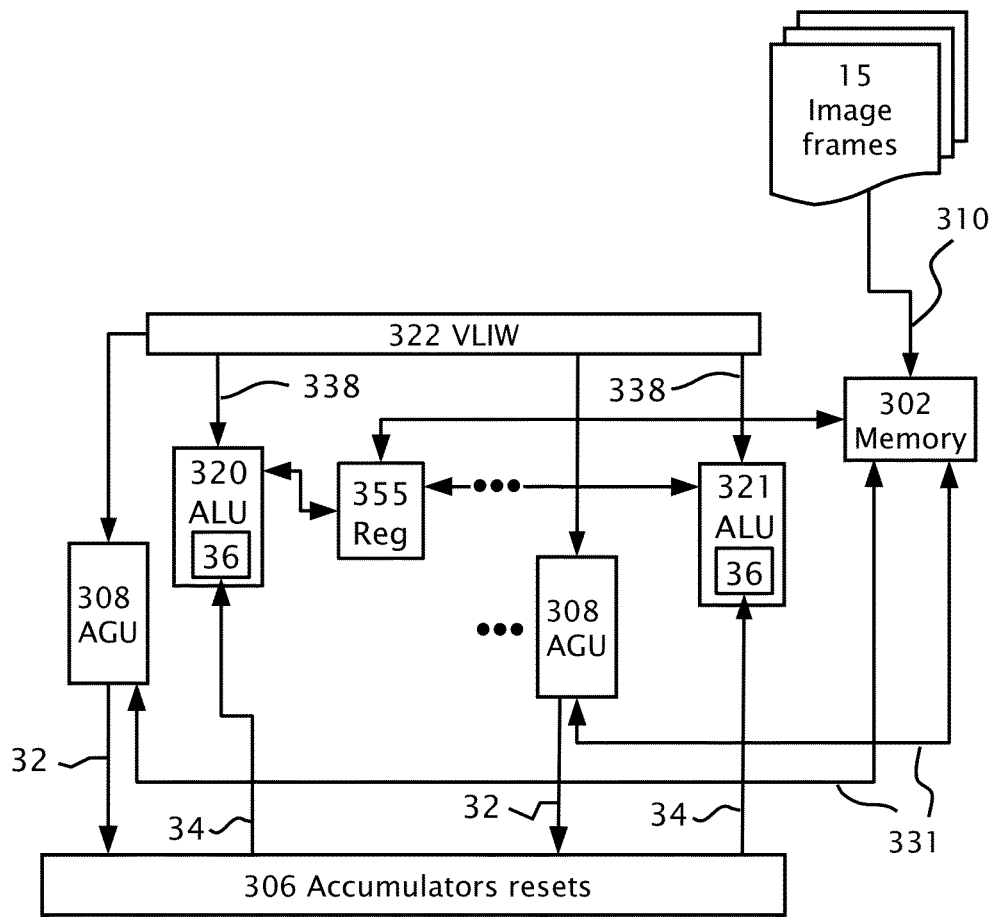
FIG. 3 which illustrates a simplified system block diagram of a processor including arithmetic logic units, according to a feature of the present invention.

Reference is now made to FIG. 3 which illustrates a simplified system block diagram of processor 30, according to an exemplary embodiment of the present invention. Memory 302 inputs multiple image frames 15 via an image frame bus 310. Processor 30 may include multiple address generator units (AGU) 308 which connect to memory 302 with a memory bus 331. AGUs 308 are operative to calculate memory addresses in real time of one or more windows of image frames 15. Arithmetic logic units (ALU) 320 and 321 (which may or may not be the same) and address generator 308 receive instructions/commands from a very long instruction word (VLIW) instruction register 322 via separate buses (thus allowing simultaneous execution of the relevant op-codes. AGUs 308 based on window dimension being processed may signal an event, e.g. end of row, end of column, over event lines 32 to accumulator reset units 306. ALUs 320 and 321 include accumulators 36 which may be resettable via accumulators reset units 306 through accumulator reset lines 34 in real time when the event signal occurs.

Memory data is loaded from memory 302 into a register file 355 from which ALUs 320/321 input data. Output results from ALUs 320/321 are loaded into register file 355.

Figure 4:
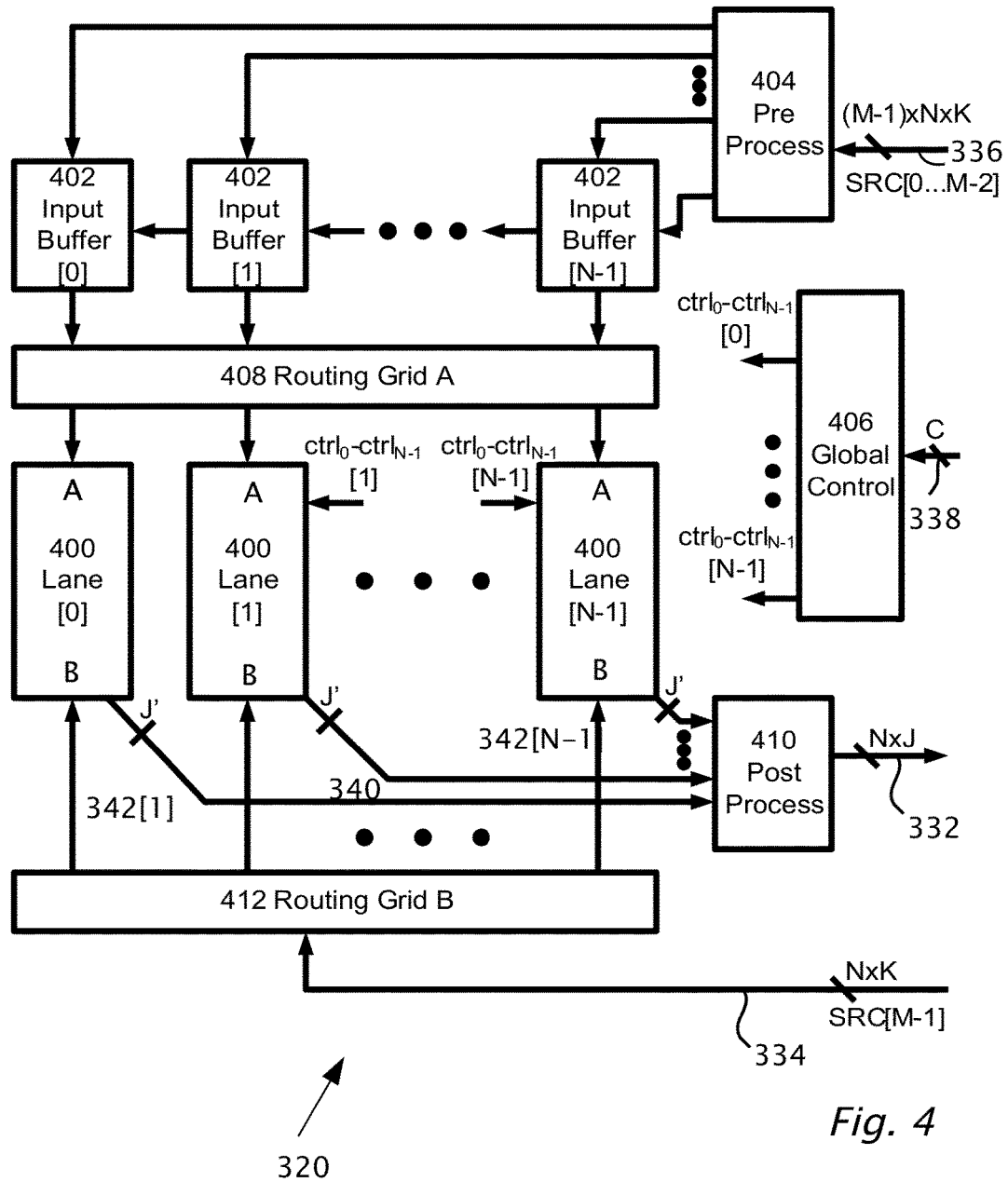
FIG. 4 shows more details of the arithmetic logic unit shown in FIG. 3, according to a feature of the present invention.

Reference is now made to FIG. 4 which shows more details of ALU 320 shown in FIG. 3, according to a feature of the present invention. ALU 320 is driven by input data according to a clock over data paths SRC[0 . . . M–2] 336 and SRC[M–1] 334 independently through multiple lanes 400.

Source operands SRC[0 . . . M–2] are input on data path 336 to a pre-processing unit 404. The number of bits per lane of data path 336 is:

$$(M-1) \times N \times K$$

where
- N is the number of words per lane 400 which is generally equal to the number of lanes 400.
- M is the number of source operands with N words each.
- K is the number of bits per word.

The multiple outputs of pre-process unit 404 connect to the inputs of respective input buffers 402. Respective outputs of buffers 402 connect to a routing grid A 408. Routing grid A 408 outputs 0 to N–1 data vectors with each vector ranging from $a_0$ to $a_{N-1}$ which are connected to respective input ports A of lanes 400.

Outputs of routing grid B 412 are input to respect ports B of lanes 400. The inputs to routing grid B 412 are from source operands SRC[M–1] via data path 334. The outputs of routing grid B 412 has 0 to N–1 data vectors with each vector ranging from $b_0$ to $b_{N-1}$.

The width of data path 334 is N lanes 400 times K bits per word. Output data paths 340 of lanes 400 feeds a post processing unit 410. The number of bits per output word along each of output data paths 340 is indicated as J'. Output data flows over data path 332 of width N lanes times J bits per output word.

Global control 406 receives control signals from VLIW 322 via lines 338. Global control 406 provides control lines $ctrl_0$ to $ctrl_{N-1}$ for respective lanes 400. and other optional control lines which are not shown to pre-processing unit 404, post processing unit 410 and routing grids 408 and 412.

Figure 5:
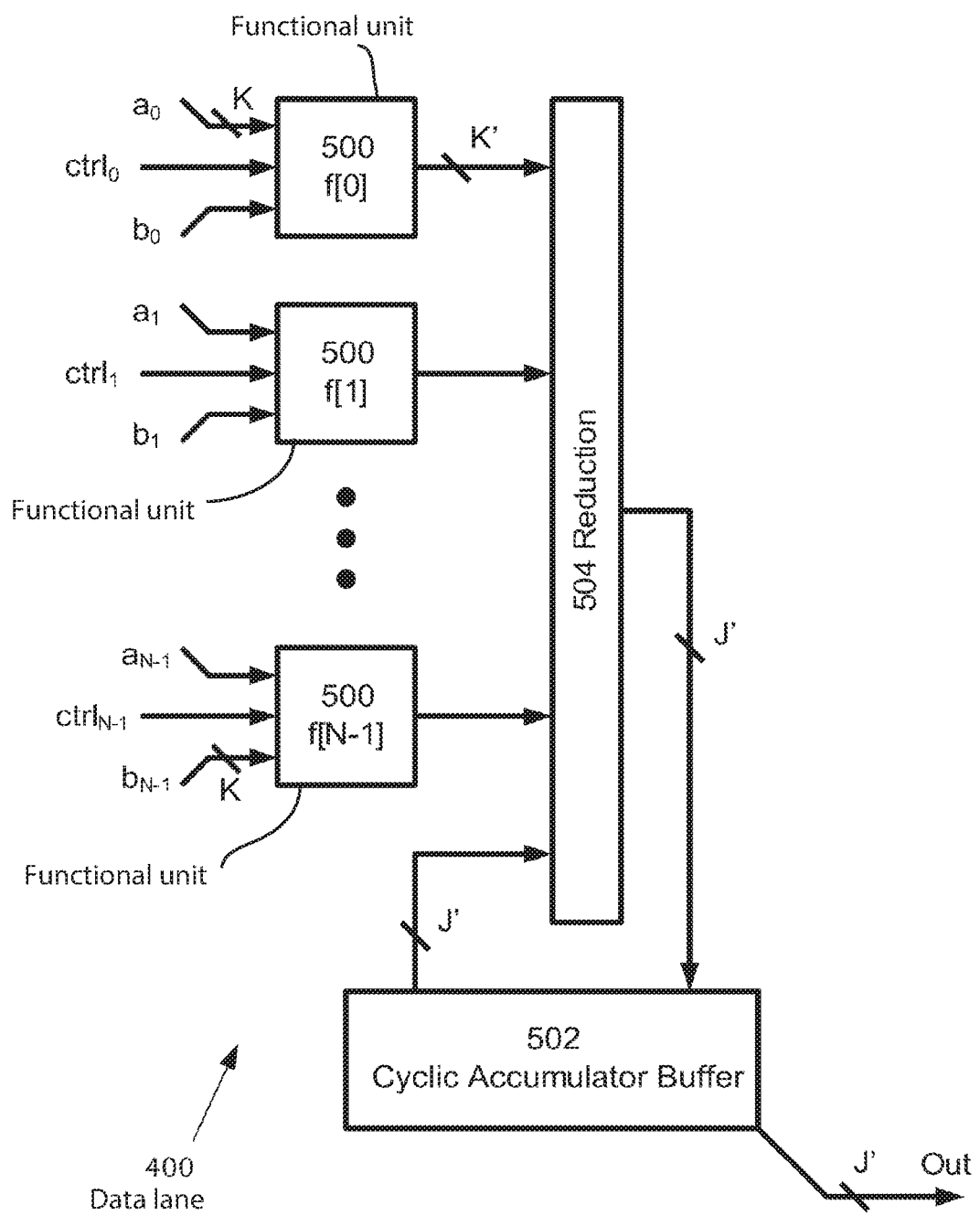
FIG. 5 illustrates a data lane as part the arithmetic logic unit shown in FIG. 4, according to a feature of the present invention.

Reference is now made to FIG. 5 which shows lane 400 in further detail, according to a feature of the present invention. Lane 400 has 0 to N–1 functional units 500, which receive vector data ($a_0$ . . . $a_{N-1}$) and ($b_0$ . . . $b_{N-1}$) K bits per word, respectively from routing grid A 408 and routing grid B 412 Functional units 500 receive control signals $ctrl_0$ . . . $ctrl_{N-1}$ from global control unit 406.

Functional units 500 are hardware wired to compute a function of inputs ($a_0$, $b_0$) . . . ($a_N$, $b_N$) such as multiplication, a*b, absolute value of difference |a–b|, and relational operations such as a<b, a<=b, etc. Other binary functions may be used in different embodiments of the present invention. Control signals $ctrl_0$ . . . $ctrl_{N-1}$ may be used to control or select the function being computed.

Outputs of functional units 500 are combined into reduction unit 504 which performs a bit reduction operation to reduce the number of bits from N words per lane times K bits per word to J' bits per output lane which is less than N times K. Examples of the bit reduction operation may be addition, a function which returns a minimum value, a function which returns a maximum value or any other commutative binary function. Data may be output from reduction unit 504 using a cyclic accumulator buffer 502 as shown in lane 400. Alternatively, data may be output from reduction unit 504 using a general register file (not shown) instead of cyclic accumulator buffer 502.

Figure 9:
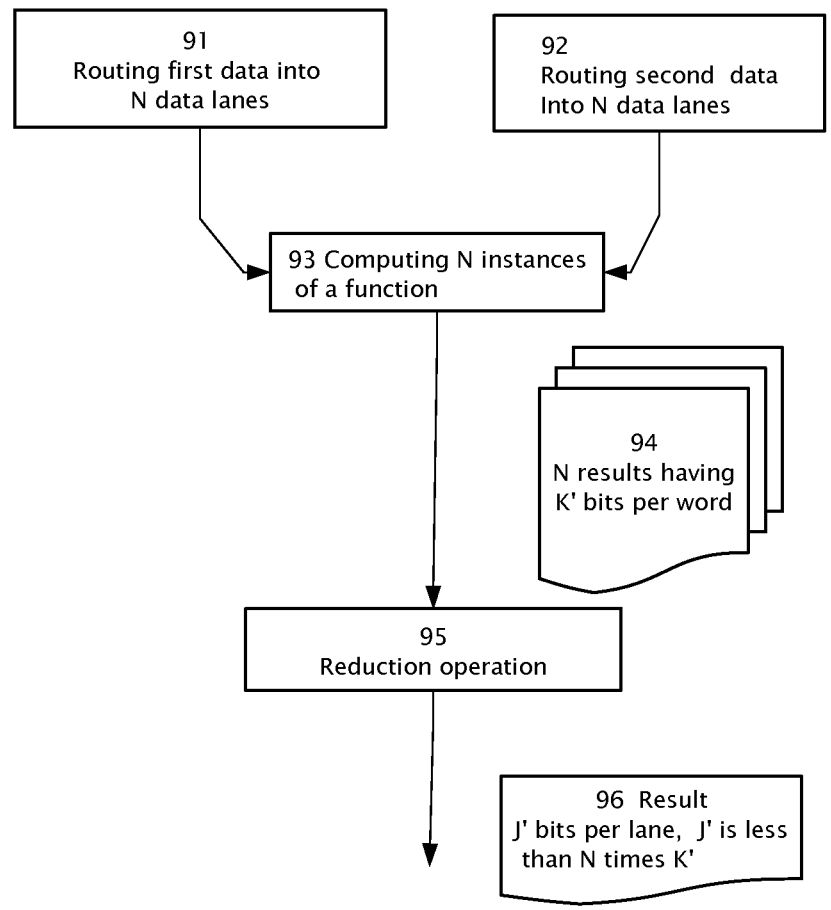
FIG. 9 illustrates a generic method according to an embodiment of the present invention

Reference is now made also to FIG. 9 which summarizes a generic method according to an embodiment of the present invention. In steps 91 and 92, first and second data are routed pairwise into N data lanes 400. In step 93, N instances of a binary function are performed on the first and second data, outputting N results 94 having K' bits per word. A bit reduction operation 95 is performed on results 94 to output one or more results 96 having J' bits per lane with J' being less than N times K'

Figure 6:
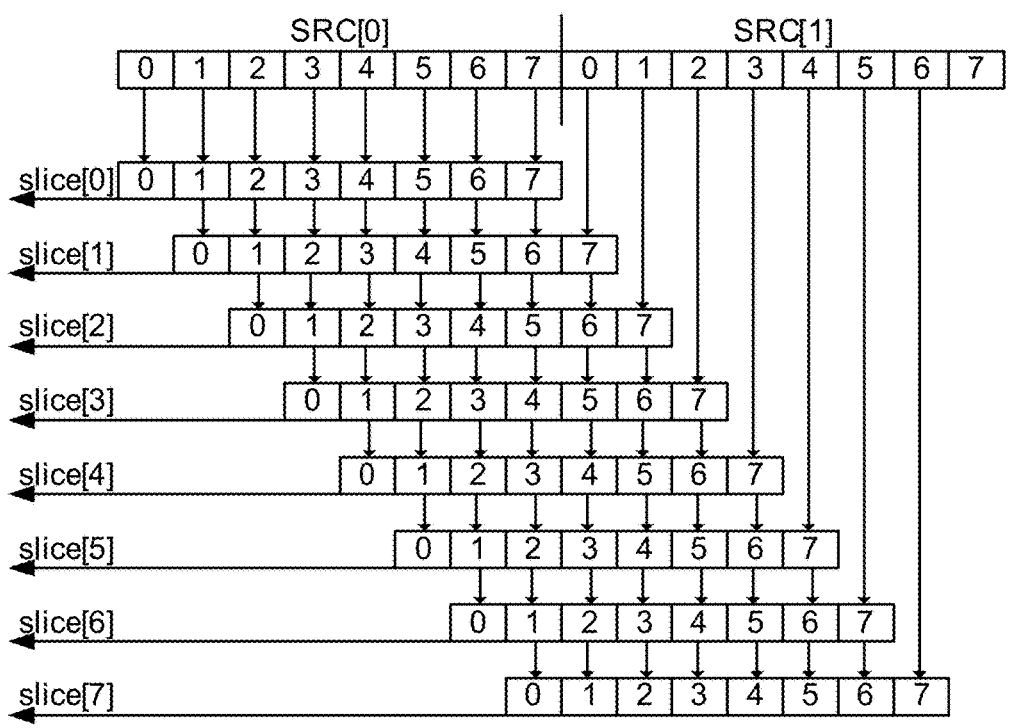
FIG. 6 shows an exemplary representation of data through the port SRC[M−1] shown in FIG. 4, according to a feature of the present invention.

Reference is now made to FIG. 6 which shows an exemplary representation of how data in respective source operands SRC[0] and SRC[1] go through the port SRC[M–1], shown in FIG. 4 as data line 334. Each lane 400[0 to N–1] correlates with slices from 0 to N–1, i.e., slice[0] to slice[N–1]. FIG. 6 shows the slices arranged for the case of 1D horizontal filtering. The operation of the pre-process unit 404 is used in the case of 1D horizontal filtering so that pre-process unit 404 is configured to generate the N possible windows ("slices") starting at X, X+1, X+2, . . . , X+N–1. Each such window contains N pixels (out of which F pixels are actually used for filtering). Further details of 1D horizontal filtering are discussed below.

Figure 7A:
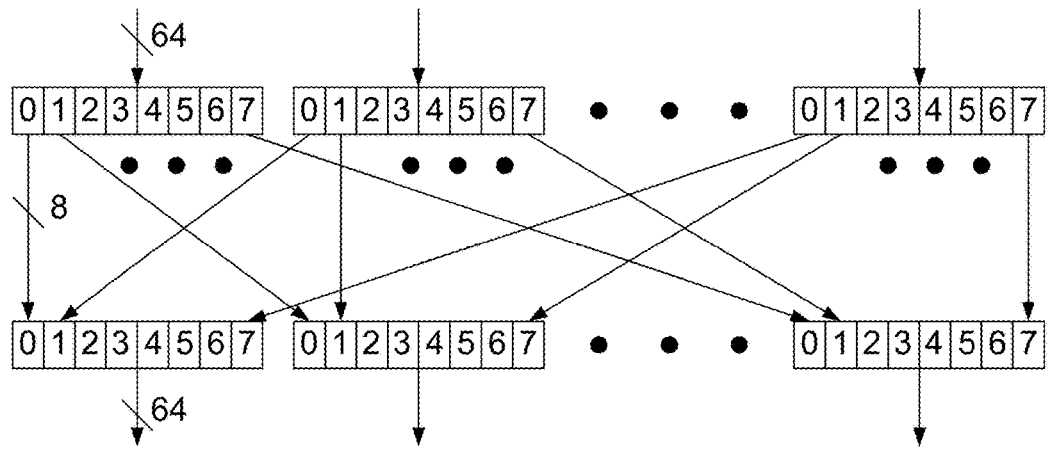
FIG. 7A illustrates an example of routing of data which may be used to achieve 1D vertical filtering, according to a feature of the present invention.

Reference is now made to FIG. 7A, which illustrates an example of a routing of data which may be used in routing grid A 408 to achieve 1D vertical filtering. 1D filtering avoids fetching N pixels from the same column by keeping an image window inside the input buffers 402, shifting the image window one row upwards at every step to get the next window, and transposing the current window (which is read row after row and not column after column) using routing grid A 408 at every step on its way to lanes 400, so that each lane 400 ultimately gets a column and not a row.

Figure 7B:
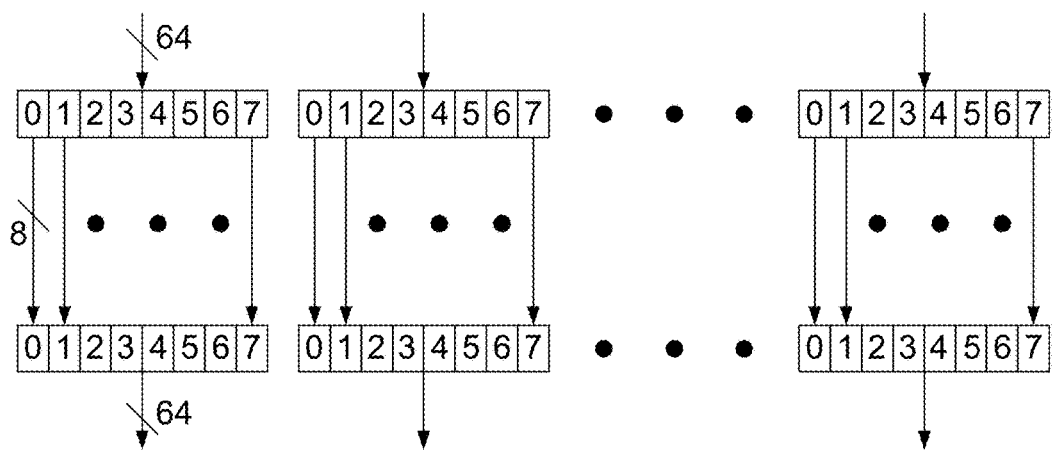
FIG. 7B illustrates an example of a routing of data which may be used to achieve 1D horizontal filtering, according to a feature of the present invention.

Reference is now made to FIG. 7B, which illustrates an example of a routing of data which may be used in routing grid A 408 to achieve 1D horizontal filtering of size at most N. Routing grid A 408 is configured so that each slice (slice[0]-slice[N–1]) is sent to its corresponding lane 400[N–1] and routing grid B 412 is configured so that the filter coefficient vector is sent to all lanes 400, i.e., routing with transposition disabled.

Figure 8A:
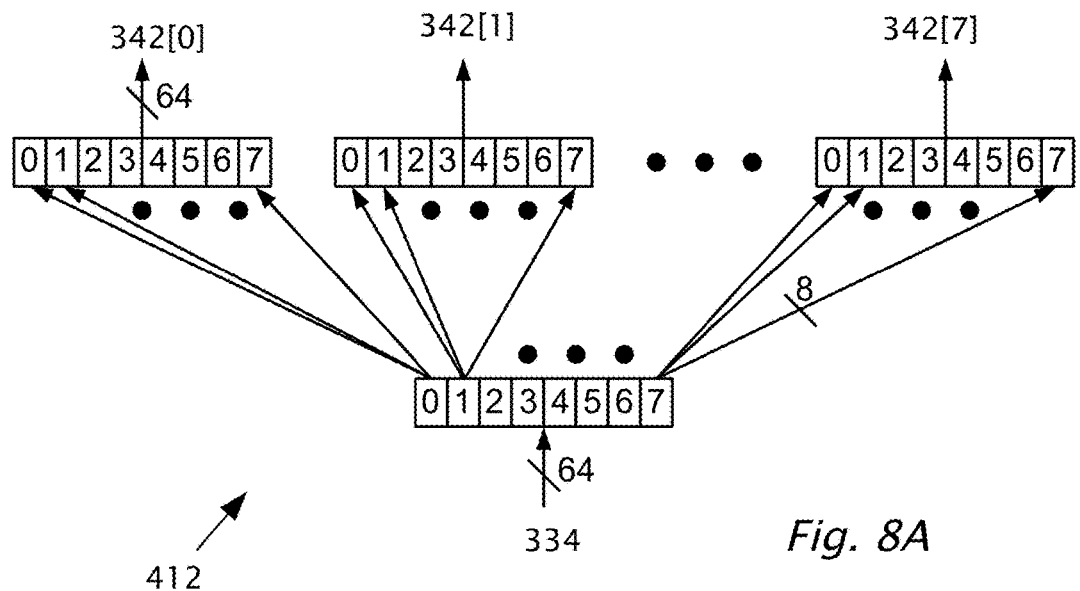
FIGS. 8A and 8B which illustrates examples of routing performed which may be used in accordance with different features of the present invention.
Figure 8B:
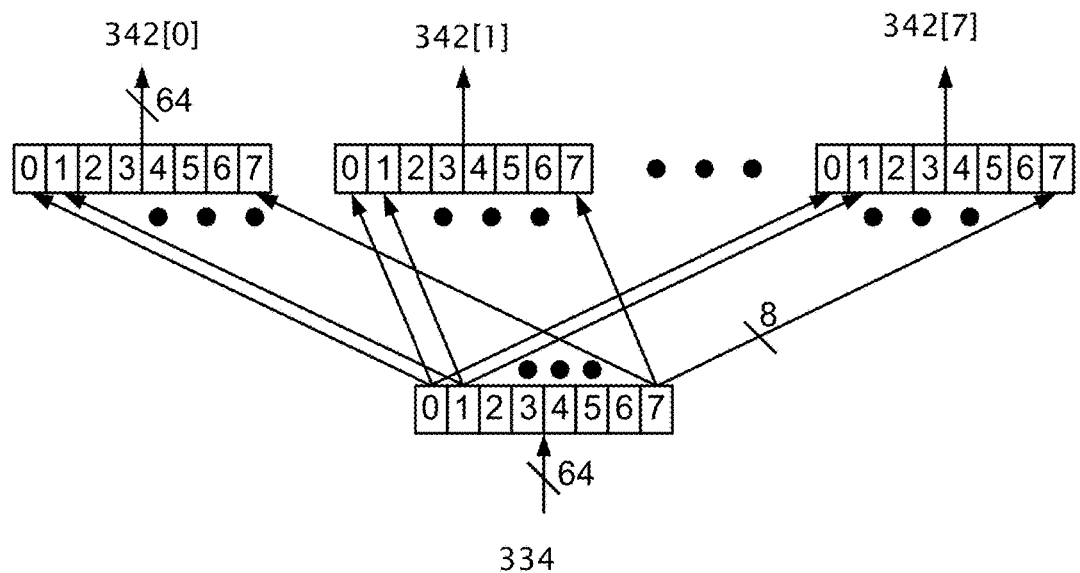

Reference is now made to FIGS. 8A and 8B which illustrates examples of routing performed which may be used in routing grid B 412. Specifically, FIG. 8A is an example of routing with transposition enabled and FIG. 8B is an example of routing with transposition disabled. Referring now to FIG. 8A with N=8 words per lane 400, N=8 lanes and K=8 bits per word, transposition is enabled. Data path 334 carries 8×8 data words to routing grid 412. The word [0] of data is transposed input to ($b_0$ . . . $b_7$) to lane 400[0] over data path 342[0]. Similarly, word [1] of data is transposed input to ($b_0$ . . . $b_7$) of lane 400[1] port B over data path 342[1], and so on until word [7] of data is transposed and input to ($b_0$ . . . $b_7$) of lane 400[7] port B over data path 342[7].

Linear Filter

Linear filtering is a common and important task in signal processing, particularly image processing. Important image processing functions such as convolution and correlation are performed using linear filtering. Conventionally, a small filter, for instance 8 by 8 pixels is scanned over an image window. Linear filtering may be performed by multiplying values, e.g. grey scale, of the filter by the corresponding intensity values of the image window. For each position of the filter relative to the window, the intermediate products are stored and summed. The sum is the datum for the filtered image window for each relative displacement between the filter and the window.

A method is now presented for implementing linear filtering using processor 30 in system 16. A first example is to start with the case of a horizontal, one-dimensional filter, and then proceed to discuss two-dimensional filters and then vertical one-dimensional filters. Numerous details for handling the different filter sizes and dimensionality are relevant for other algorithms besides linear filtering that are described later.

1D Horizontal Filter of Size at Most N

Consider a 1D horizontal filter of size F, where F<=N. The method performs N correlations in parallel and N nearby image windows are correlated with the filter. Specifically, if the leftmost image window is located at a horizontal coordinate X and includes the pixels up to X+F, the N windows [X,X+F), [X+1,X+1+F),[X+2,X+2+F), . . . ,[X+N−1,X+N−1+F) will be processed in parallel.

The total number of pixels in all of these N windows is N*F (at most N^2 when F==N). However, the windows overlap, so N−1+F pixels need are read from the range [X,X+N−1+F), which is contained in the range [X,X+N*2).

The method for 1D horizontal filter is as follows. The N*2 pixels at [X,X+N*2) are fed to ALU 320 through ports SRC[0] and SRC[1] on data line 336. Pre-process unit 404 is configured to generate the N possible windows ("slices") starting at X,X+1,X+2, . . . ,X+N−1. Each such window contains N pixels (out of which F pixels are actually used for filtering). The operation of the pre-process unit 404 that is used in this linear filtering method is illustrated in FIG. 6 for the case where N=8.

At the same time, the filter coefficients are fed to ALU 320 through the port SRC[M−1] on data line 334. Input buffers 402 are bypassed. Routing grid A 408 is configured so that each slice is sent to its corresponding lane 400 (as shown in FIG. 7B), and routing grid B 412 is configured so that the filter coefficient vector is sent to all lanes (as shown in FIG. 8B).

Each lane 400 correlates a slice with the filter—functional units 500 are configured to perform multiplication (a*b), and the reduction block 504 is configured to perform addition, so that the N a*b products are added to an accumulator from the accumulator buffer 502. For the case when F<=N, the accumulator is reset (set to 0) at every step so that a plain sum of N products is obtained. Note that in the linear filtering case, only a single accumulator may be used from each accumulator buffer 502.

The sum of the N products (some of which are zeros when F<N) obtained at lane number 0 400 is the correlation result for window [X,X+F), the sum at lane number [1] 400 is the result for window [X+1,X+1+F), etc. This result is output on ports 340, and, through the post-processing unit 410, to the outside (possibly, to a general-purpose register file) on port 332. The post-processing unit 410 can, among other things, perform a further reduction in the number of output bits, for example by truncating a configurable number of the sums' least significant bits (LSBs), and optionally rounding the sums before the truncation.

1D Horizontal Filter of Arbitrary Size

Now consider the case of a larger 1D horizontal filter, when F>N. Let S be the smallest integer such that F/S<=N. Then the correlation result for window [X,F) will be obtained in the accumulator 502 after S steps, where each step is performed similarly to the method described above for F<=N, the difference being in the data fed to ALU 320 at each step.

Specifically, at the first of the S steps, the pixels [X,X+N*2) are fed to ALU 320 precisely as described above. At the second step, the pixels [X+N,X+N*3) are fed on the same port 336, at the third step, the pixels [X+N*2,X+N*4), and so on. Similarly, at the first step, filter coefficients 0 to N are fed to ALU 320 on the port 334, then the coefficients N to N*2, then N*2 to N*3, etc. The accumulator 502 is only reset at the first of each S steps, just after a result for the window [X+i,X+i+F) was obtained at lane number i 400, at this point, processing of the next N windows is about to start.

Note that the filter coefficients are not stored inside ALU 320, rather, the filter coefficients are continuously fed to ALU 320. The filter coefficients continuously fed to ALU 320 are important for large filters which would not fit into an ALU-local storage.

2D Filter

The 2D filter case is rather similar to the large 1D filter case—again, the difference is only in the data that is fed to the ALU 320. Specifically, if the number of rows in the 2D filter is R, then R*S steps are performed rather than S for each N windows, and accumulator 502 is reset only once every R*S steps.

After obtaining the correlation of the first filter row with the first rows of N image windows—which is done in S steps precisely as described above, proceed to feed the next row of the filter coefficients, and the next row of the image starting at coordinate X,Y+1, and keep feeding rows until, and including, the row starting at X,Y+R−1. After R*S steps, the accumulator 502 at lane number i 400 will keep the result of a full 2D correlation for the window at [X+i,X+i+F)×[Y, Y+R).

1D Vertical Filter

The last notable case described herein is that of a vertical 1D filter. The vertical 1D filter is a special case of a 2D filter but it would be inefficient to use the same method for 1D filters as the one presented for 2D filters. Specifically, for a filter of F coefficients, F steps are performed, with only one multiplication doing useful work per lane 400; overall, with N lanes 400, there are N useful multiply-accumulates per step, as in a typical N-wide SIMD ALU. Instead, a method utilizing the N^2 functional units of ALU 320 is presented.

For example, the case where F<=N—the filter size is at most N. Larger filters can be handled by correlating the image separately with each N-sized sub-vector of the filter, outputting the result to a local memory buffer, and adding these partial correlations. A VLIW SIMD host processor, in particular, is well-suited to perform the computation of a partial correlation at ALU 320 in parallel with updating an accumulator buffer in memory using the other computational resources of the VLIW SIMD host processor.

The purpose in the case of the 1D vertical filter is to correlate image window columns with the filter coefficients, instead of window rows as in the case of a horizontal filter, because with columns, each lane 400 can do a full correlation (N multiply-accumulates) at every step. The filter coefficients are fed as in the horizontal case—the difference is in the feeding of image data, so that a lane 400 gets a window column instead of a window row.

The reason the difference between 1D vertical filter and 2D filtering is not trivial is that, assuming the image is stored in a rows-first memory layout, and the memory has a bus of width N, N pixels can be fetched easily from the same row at every step, but not N pixels from the same column. One way around not fetching N pixels from the same column, is to keep an image window inside the input buffers 402, shift the image window one row upwards at every step to get the next window, and transpose the current window (which is read row after row and not column after column) using routing grid A 408 at every step on its way to lanes 400, so that each lane 400 ultimately gets a column and not a row.

At each step, N pixels from an image row are fed to ALU 320 through port SRC[0] 336. As shown in FIG. 4, buffers 402 are connected to their neighbors: buffer number [1] 402 can send data to buffer number 0 402, buffer number [2] 402 can send data to buffer number [1] 402, etc. Rows thus propagate from a buffer 402 to the next; a new row takes N steps to propagate to buffer number [0] 402. At this point, the N rows of an N×N image window reside inside the input buffers 402.

Since N pixels from a next image row are fed at every step, and the already-existing rows propagate to the next buffer 402 in the chain, there is, at every step, an N×N window based at X,Y, then X,Y+1, then X,Y+2, etc. When passing over of these windows is done, move on to X+N, and go over the windows at X+N,Y, then X+N,Y+1, etc. Each such window contains N columns of height N, and the first F elements of each column must be correlated with the vertical 1D filter. To feed these columns to the lanes 400, the routing grid A 408 is configured as shown in FIG. 7A (the drawing assumes N=8).

In the above N columns of size F per step have been correlated, doing N×F useful multiply-accumulates.

Linear Filtering on the Presented Alu—Summary

To summarize, the presented methods of operation of system 30, according to embodiments of the present invention above have the following desirable characteristics:
High compute throughput—N×F operations per step, and close to N^2 for large filters.
Low input/output bandwidth to sustain this throughput—between 2N and 3N items.
Support for large filters which preclude₁₃ usage of ALU-local storage.
Efficient support for different filter sizes and dimensionality.

Matrix Multiplication

The following description presents mapping of matrix multiplication for the case where an output matrix is of size up to N×N. Larger output matrices—say, 3N×5N—can be handled efficiently by computing each N×N sub-matrix in a separate stage—for example in a total of 3×5=15 stages, as the operations required to compute each output sub-matrix are independent. Suppose input matrices A and B are of size N×L and L×N, resulting in an N×N output matrix (in most interesting cases, L is significantly larger than N). Then the computation will take L+N steps (during which the L×N×N multiplications required by the problem statement are performed). N×N partial sums are kept inside the lanes' 400 cyclic accumulator buffers 502 (with each buffer 502 keeping N partial sums).

After L+N steps, the final N×N output matrix is available in the cyclic accumulator buffers 502. The final N×N output matrix can be read out in a separate step or in parallel with the next stage. So if there are 3×5 N×N sub-matrices to compute, the first can be read out while the second is computed, the second while the third is computed, etc. The final output matrix coefficients go through the post-processing unit 410, where the final output matrix coefficients can be optionally rounded and/or have their lower bits truncated to save space, or undergo other transformations.

The L+N steps it takes to process input matrices of size N×L and L×N can be logically broken down to L/N+1 stages each taking N steps. At each such N steps, two things happen in parallel: an N×N sub-matrix of the first input matrix A is multiplied by the corresponding N×N sub-matrix of the second input matrix B; and at the same time, the next N×N sub-matrix of A is loaded into the input buffers 402. (The reason for L+N steps and not L steps is because each stage takes N steps, and there is an extra stage at the beginning when the first sub-matrix of A is loaded but there is no already-loaded sub-matrix of A to multiply by a sub-matrix of B in the meanwhile.)

In order to support matrix multiplication, the input buffers 402 must each have 2 registers keeping N elements each: one for the current N-element row of the N×N sub-matrix, and one for the next. As shown in FIG. 4, buffers 402 are connected to their neighbors: buffer number [1] 402 can send data to buffer number [0] 402, buffer number [2] 402 can send data to buffer number [1] 402, etc.

The N N-element rows of the N×N sub-matrix are fed to the ALU 320 in N steps from port SRC[0] 336. Each row is sent, through the pre-processing unit 404, to input buffer number N−1 402. At each step, each of the N buffers 402 sends the N-element row of the next N×N sub-matrix that it received at the previous step to its neighbor buffer 402. This way, row 0, read from port SRC[0] 336 at step 0, will take N steps to propagate to buffer number 0 402; row 1, read at step 1, will take N−1 steps to propagate to buffer number 1 402; and so on until row N−1.

After N steps, row number i will reside in input buffer number i 402 as intended. At this point—the beginning of the next N-step stage—all input buffers 402 simultaneously copy their input rows to the "current row" registers from the "next row" registers where they kept the rows during the previous stage. The N rows of A are now ready to be multiplied by the corresponding N×N sub-matrix of B.

This multiplication—happening in parallel to the filling of input buffers' 402 "next row" registers as pointed out above—is carried out as follows. According to the problem definition, each row in the N×N sub-matrix of A must be multiplied by each column in the N×N sub-matrix B—overall, N^3 scalar multiplications, or N^2 row-by-column multiplications. This naturally takes N steps on an ALU 320 because the ALU 320 is capable of N^2 simultaneous scalar multiplications, or N simultaneous row-by-column multiplications.

At each step, a single column of an N×N sub-matrix of B corresponding to the N×N sub-matrix of A currently residing in input buffers 402 is fed to the ALU 320 through the port SRC[M−1] 334. The B sub-matrix column is sent to the lanes 400 through the routing grid B 412, with the grid 412 configured to broadcast all column elements to all the N lanes 400 as shown in FIG. 8B. At the same time, each of the input buffers 402 sends its A sub-matrix row to the lanes 400 through the routing grid A 408, with the grid 408 configured so that lane number I 400 receives row number I as shown in FIG. 7B.

Thus each of the lanes 400 receives an N-element row of A's N×N sub-matrix (a different row for every lane) and an N-element column of B's N×N sub-matrix (the same column for all lanes). The functional units 500 are configured to perform multiplication (a*b) and the reduction unit 504 is configured to perform addition, so that the lane 400 computes the dot product of the row and the column. The dot product is added to the contents of an accumulator from the cyclic accumulator buffer 502 which keeps zero at the first N-step stage, and the sum of the dot products of the previous sub-rows and sub-columns of A and B at the next N-step stages, so that after the last stage, cyclic accumulator buffer 502 keeps the dot product of a full row of A with a full column of B. At each of the N steps, a different accumulator is selected from the cyclic accumulator buffer 502; when accumulator N−1 is reached, the next accumulator to be selected is (again) accumulator 0 —which happens when the next N-step stage is started.

As can be seen from the above description, at each of the N steps making up a stage, a different column of the N×N sub-matrix of B will be multiplied by all the rows of the N×N sub-matrix of A, updating a unique accumulator keeping the (partial) dot product of the full row and the full column which the N-element sub-row and sub-column are "cut out of".

The method described above thus allows the performance of matrix multiplication so that N^2 multiply-accumulate operations are performed while the bandwidth consumed is 2*N inputs.

The method also has a practical advantage of fitting to the case when the matrix B is laid out, in memory, in a column-first fashion—that is, its logical columns correspond to the rows of physical memory (it is then when it's easy to feed to the ALU 320 the columns of N×N sub-matrices of B). This memory layout is the common one in computer vision applications such as classification where the rows of A are image features and the rows of B are support vectors, among other examples.

Median Filter

Next is a method for computing a median filter—the median of a window around each image pixel—using ALU 320.

The method is based on a more basic method for counting the number of pixels below a per-window threshold in a window around each image pixel. Such counting can be done, for the various window shapes (vertical/horizontal/2D), in a way quite similar to linear filtering, with the following differences:

Functional units 500 are configured to perform comparisons (a<b) instead of multiplications.

Routing grid B 412 is configured as shown in FIG. 8A (for N==8). This way, each lane 400 compares each pixel of a window row that it gets from routing grid A 408 to the same threshold, while each lane 400 processes a different threshold. This is consistent with an intent to use the same threshold for all pixels in a window but a different threshold for each window (unlike the filtering case where each pixel is multiplied by a different coefficient, but the same filter is used for each window).

Using this pixel-counting method, it is possible to iteratively compute the median as follows. Per-window thresholds are initialized to half the maximal intensity value (for instance, 128 for 8-bit pixels), and the number of pixels below that level is counted. The obtained per-pixel count may be compared to half the number of pixels in a window (using, not ALU 320, but other computational resources of the host SIMD VLIW processor). For instance, for a 5×5 window, the count is compared to 25/2=12. For pixels with count exceeding half the window size, it is known that the median is above half the maximal intensity value; for the rest, it is known that the median is below the maximal intensity value.

Effectively, the most significant bit of the median has been computed—1 for some pixels, 0 for others. The per-pixel threshold for the next iteration will have its MSB set accordingly; its next most-significant bit will, again, be 1. Counting the pixels below that threshold and comparing to half the window size will, again, tell us whether the new bit is in fact 1 or 0 for each pixel.

Next, the other bits of the median are computed, moving from the MSB to the LSB. At each iteration, the per-pixel threshold is based on the current approximation of the median. In fact, one advantage of this method is that at any point it is possible to stop—if a 4-bit approximation of the median is enough, it is also possible to stop after 4 iterations, saving the run time of the remaining iterations.

The main advantage of this method is that "the heavy lifting" is done by the high-throughput ALU 320. For instance, with a 2D F×F window, N×F compare-and-accumulate operations per step would be done (N windows in parallel are processed), and there is only a need of F×K/N steps (K iterations assuming K-bit pixels, times F×F compare-and-accumulate operations per pixel per iteration divided by the ALU 320 throughput of N×F. With N=8, K=8 and F=5—a 5×5 median filter of 8-bit pixels—only 5 steps per pixel are needed.

Local Maximum Filter

Two types of local maximum filter are considered in the description that follows. In one type, the maximal value of each image window is computed. In another, for each image window, a non-zero value is produced if the pixel value at its center is greater than or equal to all the pixels around it, and a zero is produced otherwise.

Computing the first type is similar to computing a linear filter, except that functional units 500 and the reduction block 504 are configured differently, and the "B-side" (the routing grid B 412, the port SRC[M−1] 334, and the "b" inputs of functional units 500) are effectively unused.

The functional units 500 are configured to select the "a" inputs—that is, the selected function is f(a,b)=a. The reduction block 504 is configured to compute the maximum of its N inputs and the accumulator. This way, if the image data is streamed into ALU 320 in the same way used to compute a linear filter, the ALU 320 will be incrementally updating the maximal value of N image windows in parallel (similarly to the incremental updating of the partial correlation of N image windows with a filter in parallel in the linear filtering case).

The method above for the first type can be applied to compute a local minimum filter by reversing the relational operations performed.

For the second type—a Boolean produced per pixel telling whether it is a local maximum or not—a method is presented not relying on being able to use minimum or maximum as a reduction operation in reduction block 504, but rather relying on summing as the reduction operation. The advantage of the method is that the method uses the reduction operation used in most other algorithms supported by ALU 320, and does not require the hardware to support more "exotic" and costlier reduction operations.

The method to produce the required Boolean is simply by counting pixels exceeding a per-pixel threshold, similar to the counting done for median filtering. The only difference is that the per-pixel threshold is set to the value of the pixel itself (rather than the current approximation of the median with one new bit set).

This way, the pixels in each window that are below that pixel are counted; if that number is equal to the window size, we have a local maximum, otherwise we do not. As in the median example, other computational resources in the hosting SIMD VLIW processor are relied on to compare the pixel count to the window size.

The method is very efficient—for example, for an F×F window, only F/N steps per output are needed. Since F×F compare-and-accumulate operations must be performed per window, and F/N steps are actually performed per window, F×F/(F/N)=N×F useful operations are performed per step.

Sad Filter

SAD (sum of absolute difference) filtering is done very similarly to linear filtering, except that functional units 500 are configured to compute |a−b| instead of a*b. Note that, similarly to the linear filtering case, for a 2D filter, each filter row requires a serial step. What is done in parallel is up to N displacements of the same filter—that is, up to N sums corresponding to these displacements are updated in parallel.

This method is efficient for template matching, where it is impossible to reuse computations between adjacent locations. This method may be less efficient than techniques based on integral images for dense disparity computations, where results for each displacement must be computed for every pixel in the image, and so partial sums of the sum of differences at adjacent locations are shared.

However, integral images may not help speed up disparity refinement computations, where for each pixel, a limited number of displacements must be checked around the position computed at a coarser level of a Gaussian pyramid. In disparity refinement, displacements to be checked are thus different for every pixel, so a per-displacement integral image is rather useless as each displacement is only relevant for a fraction of pixels. Here, the method is again may be very efficient, since for every pixel, it is possible to update the sums of differences corresponding of up to N displacements in parallel.

To summarize, the benefits of the above method, allowing the performance of up to N^2|a−b| operations while consuming bandwidth of only N*3 inputs, are greatest in cases where these operations are not redundant and cannot be avoided, such as template matching and disparity refinement.

Common Benefits of Using Alu 320

High compute throughput—much more operations than N per step, N^2 in many cases
Low I/O bandwidth comparatively to the throughput—M*N where M is much less than N, 2 or 3 in the examples above
Support for a relatively wide variety of algorithms with the same acceleration circuit, in particular, many of the heavyweight algorithms used in computer vision
Support for many input shapes and sizes The indefinite articles "a", "an" is used herein, such as "an arithmetic logic unit", has the meaning of "one or more" that is "one or more arithmetic logic units".

Although selected features of the present invention have been shown and described, it is to be understood the present invention is not limited to the described features. Instead, it is to be appreciated that changes may be made to these features without departing from the principles and spirit of the invention, the scope of which is defined by the claims and the equivalents thereof.

We claim:

1. An arithmetic logic unit comprising:
a first routing grid connected to N data lanes, wherein the first routing grid is adapted to drive first data to the N data lanes and is configurable via control signaling to selectively drive the first data in either: a first routing mode that includes transposition of the first data, or a second routing mode that excludes transposition of the first data;
a second routing grid connected to the N data lanes, wherein the second routing grid is adapted to drive second data to the N data lanes and is configurable via control signaling to selectively drive the second data in either: a third routing mode that includes transposition of the second data, or a fourth routing mode that excludes transposition of the second data;
a pre-processing unit;
N input buffers; wherein the first routing grid comprises N inputs that are coupled to N outputs; wherein each output out of the N outputs of the first routing grid is coupled to a single data lane;
wherein each of the N data lanes includes a plurality of N functional units with first inputs from the first routing grid and second inputs from the second routing grid;
wherein each of the N data lanes includes a reduction unit that is adapted to receive output signals from the N functional units, wherein the reduction unit is configured to perform a reduction operation and output an output result; and
wherein the functional units are operable to compute a function of the respective first data on the respective first inputs and of the respective second data on the respective second inputs.

2. The arithmetic logic unit of claim 1, wherein the pre-processing unit is configured to receive N*2 pixels and to generate, as the first data, N slices that differ from each other by one pixel; wherein different slices of the N slices are fed, by the first routing grid, to different data lanes of the N data lanes; wherein the second routing grid is configured to feed a coefficient vector, as the second data, to each of the N data lanes; wherein each data lane is configured to perform a multiplication between a slice provided to the data lane and the coefficient vector to provide N products calculated by the N functional units of the data lane; and wherein each reduction unit is configured to calculate a sum by adding the N products calculated by the N functional units of the data lane.

3. The arithmetic logic unit of claim 1, further comprising a post processor that is configured to receive outputs of the N data lanes and perform a further reduction in a number of output bits of the outputs of the N data lanes.

4. The arithmetic logic unit of claim 3 wherein the post processor is configured to truncate a configurable number of least significant bits of the outputs of the N data lanes.

5. The arithmetic logic unit of claim 1 wherein the arithmetic logic unit is prevented from storing the first and the second data.

6. The arithmetic logic unit of claim 1, wherein each data lane comprises a cyclic accumulator buffer that is coupled to the reduction unit of the data lane;
wherein when the arithmetic logic unit is used to perform a filtering operation by a filter that is represented by the coefficient vector then the cyclic accumulator buffer is reset thereby outputting from each cyclic accumulator buffer, as a filtering operation result, the sum.

7. The arithmetic logic unit according to claim 1, wherein each data lane comprises a cyclic accumulator buffer that is coupled to the reduction unit of the data lane; wherein each cyclic accumulator buffer is configured to store N output results of the reduction unit.

8. The arithmetic logic unit of claim 1 wherein each one of the N input buffers is coupled to a single input of the N inputs of the first routing grid; and wherein the N input buffers are also serially coupled to each other.

9. The arithmetic logic unit of claim 1, further comprising: a global control block configured to control the function of the functional units and to control first routing of the first routing grid and to control second routing of the second routing grid.

10. The arithmetic logic unit of claim 1, wherein the function is performed between a datum a of the first data and a datum b of the second data, wherein the function is selected from the group consisting of: a+b addition, a−b subtraction, a*b multiplication, a relational operation between a and b and absolute value of a difference ABS(a−b).

11. The arithmetic logic unit according to claim 1, wherein each cyclic accumulator buffer is configured to store N output results ofthe reduction unit.

12. The arithmetic logic unit of claim 1, further configured for performing matrix multiplication of input matrices A and B to produce an N×N output matrix, wherein:
the first routing grid is adapted to drive the first data to the N data lanes so that the N data lanes receive respective rows of input matrix A;
the second routing grid is adapted to drive a B matrix column as the second data to the data lanes; and
wherein the functional units are operable to compute N instances of a multiplication function of the respective first data and the respective second data, thereby outputting N results.

13. The arithmetic logic unit according to claim 12 wherein each cyclic accumulator buffer is configured to store N output results of the reduction unit.

14. The arithmetic logic unit according to claim 12 wherein the first routing grid is preceded by N input buffers; wherein each input buffer comprises a first buffer for storing a current row of matrix A and a second buffer for storing a next row of matrix A.

15. The arithmetic logic unit according to claim 12 wherein the N input buffers are serially coupled to each other and are configured to serially propagate the next rows of matrix A between first buffers of the N input buffers.

16. The arithmetic logic unit according to claim 15, wherein the N input buffer are configured to serially propagate the next rows while providing the current rows to the first input grid.

17. The arithmetic logic unit of claim 12, wherein the arithmetic logic unit is prevented from storing the first and the second data.

18. The arithmetic logic unit of claim 12, wherein the second data is continuously driven to the data lanes; and wherein memory resources of each data lane are limited to a single cyclic accumulator buffer that is coupled to the reduction unit.

19. The arithmetic logic unit of claim 12, wherein the arithmetic logic unit is prevented from storing the first and the second data.

20. The arithmetic logic unit of claim 1, wherein the second data is continuously driven to the N data lanes; and wherein memory resources of each data lane are limited to a single cyclic accumulator buffer that is coupled to the reduction unit.

21. A computational method performable by an arithmetic logic unit, the method comprising:
driving first data, by a first routing grid, to a plurality of data lanes, including providing control signaling to the first routing grid to selectively drive the first data in either: a first routing mode that includes transposition of the first data, or a second routing mode that excludes transposition of the first data;
driving second data, by a second routing grid that is connected to the plurality of data lanes, including providing control signaling to the second routing grid to selectively drive the second data in either: a third routing mode that includes transposition of the second data, or a fourth routing mode that excludes transposition of the second data; and
in each data lane of the plurality of data lanes:
(i) computing, by a plurality of N functional units of the data lane, N instances of a function of the respective first data and the respective second data, thereby outputting N results;
wherein the plurality of N functional units are with first inputs from the first routing grid and second inputs from the second routing grid; and
performing an operation on the N results thereby outputting an output result.

22. The computational method of claim 21, comprising receiving, by a pre-processing unit of the arithmetic logic unit, N*2 pixels; generating by the pre-processing unit, as first data, N slices that differ from each other by one pixel; feeding different slices of the N slices, by a first routing grid of the arithmetic logic unit, to different data lanes of N data lanes of the arithmetic logic unit; wherein the first routing grid is connected to the N data lanes; wherein the first routing grid comprises N inputs that are coupled to N outputs; wherein each output out of the N outputs of the first routing grid is coupled to a single data lane; feeding, by a second routing grid of the arithmetic logic unit a coefficient vector, as second data, to each of the N data lanes; wherein the second routing grid is connected to the N data lanes; and wherein in each data lane of the N data lanes performing a multiplication between a slice provided to the data lane and the coefficient vector; wherein the multiplication comprises calculating N products by N functional units of the data lane, and calculating a sum of the N products by a reduction unit of the data lane.

23. The computational method according to claim 22 wherein the 2*N pixels are from an image captured by a camera or image sensor.

24. The computational method of claim 21, further comprising receiving by a post processor, outputs of the N data lanes and performing, by the post processor, a further reduction in a number of output bits of the outputs of the N data lanes.

25. The computational method of claim 24 wherein the performing of the further reduction comprises truncating a configurable number of least significant bits of the outputs of the N data lanes.

26. The computational method of claim 21, further comprising: avoiding storage inside the arithmetic logic unit, of the first and second data.

27. The computational method according to claim 21, wherein the method comprises avoiding storage in the arithmetic logic unit of the first and the second data.

28. The computational method of claim 21, wherein each data lane comprises a cyclic accumulator buffer that is coupled to the reduction unit of the data lane;
wherein when the arithmetic logic unit is used to perform a filtering operation by a filter that is represented by the coefficient vector then the method comprises resetting the cyclic accumulator buffer thereby outputting from each cyclic accumulator buffer, as a filtering operation result, the sum.

29. The computational method according to claim 21 wherein each cyclic accumulator buffer is configured to store N output results of the reduction unit.

30. The computational method according to claim 21 that is executed during a pedestrian detection.

31. The computational method according to claim 21 that is executed during a traffic sign recognition.

32. The computational method according to claim 21 that is executed during a forward collision warning.

33. The method according to claim 21 wherein each one of the N input buffers is coupled to a single input of the N inputs of the first routing grid; and wherein the N input buffers are also serially coupled to each other.

34. The method according to claim 21 further comprising: a global control block configured to control the function of the functional units and to control first routing of the first routing grid and to control second routing of the second routing grid.

35. The method according to claim 21 wherein the function is performed between a datum a of the first data and a datum b of the second data, wherein the function is selected from the group consisting of: a+b addition, a−b subtraction, a*b multiplication, a relational operation between a and b and absolute value of a difference ABS(a−b).

36. The method according to claim 21 wherein the arithmetic logic unit is prevented from storing the first and the second data.

37. The method according to claim 21 wherein each cyclic accumulator buffer is configured to store N output results of the reduction unit.

38. The computational method of claim 21, further adapted for performing matrix multiplication of input matrices A and B to produce an N×N output matrix, wherein N is a positive integer that exceeds one, by using an arithmetic logic unit, wherein:
the first data is driven to the plurality of data lanes of the arithmetic logic unit using the first routing grid so that the data lanes receive respective rows of input matrix A;
the second data is driven to the plurality of data lanes of the arithmetic logic unit using the second routing grid so that the data lanes receive respective columns of input matrix B;
wherein each of the plurality of data lanes includes a reduction unit with inputs from the functional units; and each of the data lanes:
(i) using the N functional units, computing the N instances of a multiplication function of the respective first data and the respective second data, thereby outputting the N results;
(ii) using the reduction unit, performing an addition operation on the N results thereby outputting an output result; and
(iii) accumulating the output result by adding to the contents of an accumulator of a cyclic accumulator buffer.

39. The computational method according to claim 38 wherein the first routing grid is preceded by N input buffer; wherein each input buffer comprises a first buffer for storing a current row of matrix A and a second buffer for storing a next row of matrix A.

40. The computational method according to claim 39 wherein the N input buffers are serially coupled to each other and the method comprises serially propagating the next rows of matrix A between first buffers of the N input buffers.

41. The computational method according to claim 40, wherein the serially propagating of the next rows occurs while providing the current rows to the first input grid.

42. The computational method according to claim 38 wherein each cyclic accumulator buffer is configured to store N output results of the reduction unit.

43. The computational method according to claim 38, wherein the second data is continuously driven to the data lanes; and wherein memory resources of each data lane are limited to a single cyclic accumulator buffer that is coupled to the reduction unit.

44. The computational method of claim 21, wherein:
the second data is continuously driven to the N data lanes; and
memory resources of each data lane are limited to a single cyclic accumulator buffer that is coupled to the reduction unit.

* * * * *

UNITED STATES PATENT AND TRADEMARK OFFICE
CERTIFICATE OF CORRECTION

PATENT NO. : 10,318,308 B2
APPLICATION NO. : 13/664475
DATED : June 11, 2019
INVENTOR(S) : Dogon et al.

Page 1 of 1

It is certified that error appears in the above-identified patent and that said Letters Patent is hereby corrected as shown below:

In the Claims

In Column 14, Line 55, in Claim 6, after "lane;", delete "¶"

In Column 18, Line 3, in Claim 38, after "and", insert --in--

Signed and Sealed this
Fourteenth Day of April, 2020

Andrei Iancu
*Director of the United States Patent and Trademark Office*